(12) United States Patent
Watanabe

(10) Patent No.: US 11,856,688 B2
(45) Date of Patent: Dec. 26, 2023

(54) ADHESIVE FILM FOR PRINTED WIRING BOARD

(71) Applicant: Tatsuta Electric Wire & Cable Co., Ltd., Higashiosaka (JP)

(72) Inventor: Masahiro Watanabe, Kizugawa (JP)

(73) Assignee: Tatsuta Electric Wire & Cable Co., Ltd., Higashiosaka (JP)

( * ) Notice: Subject to any disclaimer, the term of this patent is extended or adjusted under 35 U.S.C. 154(b) by 577 days.

(21) Appl. No.: 17/055,732

(22) PCT Filed: Jul. 5, 2019

(86) PCT No.: PCT/JP2019/026843
§ 371 (c)(1),
(2) Date: Nov. 16, 2020

(87) PCT Pub. No.: WO2020/009229
PCT Pub. Date: Jan. 9, 2020

(65) Prior Publication Data
US 2021/0212197 A1 Jul. 8, 2021

(30) Foreign Application Priority Data

Jul. 6, 2018 (JP) ................................. 2018-129319

(51) Int. Cl.
*H05K 1/02* (2006.01)
*C09J 7/29* (2018.01)
(Continued)

(52) U.S. Cl.
CPC ............ *H05K 1/0218* (2013.01); *B32B 7/12* (2013.01); *B32B 27/06* (2013.01); *B32B 27/281* (2013.01); *C09J 7/29* (2018.01); *C09J 7/38* (2018.01); *C09J 9/02* (2013.01); *H05K 3/4644* (2013.01); *B32B 2255/10* (2013.01); *B32B 2307/206* (2013.01); *B32B 2457/08* (2013.01); *C09J 2301/162* (2020.08); *C09J 2463/00* (2013.01); *C09J 2463/006* (2013.01); *C09J 2467/006* (2013.01)

(58) Field of Classification Search
CPC .. H05K 1/0218; H05K 1/0224; H05K 1/0225; H05K 1/0227
See application file for complete search history.

(56) References Cited

U.S. PATENT DOCUMENTS

2010/0177397 A1    7/2010   Kamiyama et al.

FOREIGN PATENT DOCUMENTS

JP     2013061636 A    4/2013
JP     2014112576 A    6/2014
(Continued)

OTHER PUBLICATIONS

WO2017179416 A1 machine translation (Year: 2017).*
(Continued)

*Primary Examiner* — Jeremy C Norris
(74) *Attorney, Agent, or Firm* — United IP Counselors, LLC; Kenneth M. Fagin

(57) ABSTRACT

An adhesive film for a printed wiring board includes an adhesive layer 111 and an insulating protective layer 112. The insulating protective layer has an areal material ratio (Smr2) of 91% or less, the areal material ratio (Smr2) dividing reduced valleys from a core.

5 Claims, 4 Drawing Sheets

(51) Int. Cl.
*C09J 7/38* (2018.01)
*B32B 7/12* (2006.01)
*B32B 27/06* (2006.01)
*B32B 27/28* (2006.01)
*C09J 9/02* (2006.01)
*H05K 3/46* (2006.01)

(56) References Cited

FOREIGN PATENT DOCUMENTS

| | | | |
|---|---|---|---|
| JP | 2015106500 A | 6/2015 | |
| JP | 2016143751 A | 8/2016 | |
| JP | WO2017179416 A1 * | 10/2017 | ............. C25D 5/605 |
| JP | 6426865 B1 | 11/2018 | |
| JP | 2019121731 A | 7/2019 | |
| WO | 2008020578 A1 | 2/2008 | |

OTHER PUBLICATIONS

International Search Report and Written Opinion dated Sep. 24, 2019, issued in International Application No. PCT/JP2019/026843.
Office Action issued in corresponding Korean Application No. 10-2020-7029073 dated Jul. 18, 2022.

* cited by examiner

Example 1

Example 2

Example 3

Example 5

Example 6

Example 4

Comparative Example 1

Comparative Example 2

Comparative Example 3

ADHESIVE FILM FOR PRINTED WIRING BOARD

TECHNICAL FIELD

The present disclosure relates to an adhesive film for a printed wiring board, an electromagnetic-wave shielding film, and a shield wiring board.

BACKGROUND ART

An electromagnetic-wave shielding film adhered to a printed wiring board is used to protect an electronic circuit from electromagnetic noises. The electromagnetic-wave shielding film includes a conductive adhesive layer and an insulating protective layer, and is adhered to a ground circuit of the printed wiring board with the conductive adhesive layer.

The insulating protective layer may contain a colorant for improving aesthetics and visibility of printing, for example. For example, Patent Document 1 attempts to improve the visibility of printing by using an insulating protective layer containing a black-based colorant.

CITATION LIST

Patent Document

PATENT DOCUMENT 1: Japanese Unexamined Patent Publication No. 2016-143751

SUMMARY OF THE INVENTION

Technical Problem

A printed wiring board includes: a base layer; a circuit pattern on the base layer, the circuit pattern being made from copper foil; and a cover lay that protects the circuit pattern. An effect of concealing the circuit pattern in the printed wiring board from outside to be invisible is also expected by the adhesion of the electromagnetic-wave shielding film to the printed wiring board. Recently, the printed wiring boards have been required to be thin, and the cover lays have tended to be thin. The thin cover lay is likely to cause, in the surface thereof, projections reflecting the circuit pattern. The present inventors found that as the cover layer becomes thinner and the projections become higher, a typical electromagnetic-wave shielding film cannot sufficiently conceal the circuit pattern.

In some cases, an electromagnetic-wave shielding function is not required, but a circuit pattern concealing property is required.

The present disclosure attempts to provide an electromagnetic-wave shielding film and an adhesive film for a printed wiring board which have an excellent circuit pattern concealing property even for a thin cover lay.

Solution to the Problem

One aspect of the present disclosure is directed to an adhesive film for a printed wiring board. The adhesive film includes: an adhesive layer, and an insulating protective layer, and the insulating protective layer has an areal material ratio (Smr2) of 91% or more, the areal material ratio (Smr2) dividing reduced valleys from a core.

In one aspect of the adhesive film for a printed wiring board, the insulating protective layer may have a reduced valley depth (Svk) of 0.45 μm or more.

In one aspect of the adhesive film for a printed wiring board, the adhesive layer may have conductivity, and the adhesive film may function as an electromagnetic-wave shielding film. In this case, the adhesive film may further include a shielding layer interposed between the adhesive layer and the insulating protective layer.

One aspect of the shield wiring board of the present disclosure includes: a circuit board including a base layer, a circuit pattern on the base layer, and an insulating film adhered to the base layer so as to cover the circuit pattern; and the electromagnetic-wave shielding film of the present disclosure adhered to the insulating film.

Advantages of the Invention

The electromagnetic-wave shielding film and the adhesive film for a printed wiring board of the present disclosure allow the circuit pattern concealing property to be greatly improved even for a thin cover lay.

DESCRIPTION OF EMBODIMENTS

Figure 1:
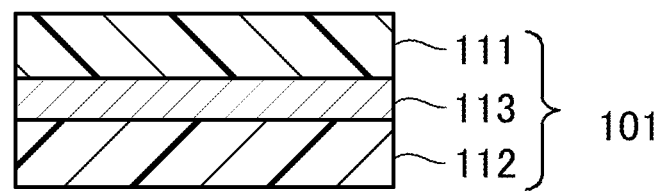
FIG. 1 is a cross-sectional view of an adhesive film for a printed wiring board according to an embodiment.

The adhesive film for a printed wiring board according to the present embodiment is an electromagnetic-wave shielding film 101 that functions as an electromagnetic-wave shield, and includes, as illustrated in FIG. 1, a conductive adhesive layer 111 and an insulating protective layer 112, and the insulating protective layer 112 has an areal material ratio (Smr2) of 91% or less, preferably 90% or less, the areal material ratio dividing reduced valleys from a core. Although a conductive shielding layer 113 is provided between the conductive adhesive layer 111 and the insulating protective layer 112 in FIG. 1, the shielding layer 113 does not have to be provided when the conductive adhesive layer 111 functions also as a shielding layer.

Figure 2:
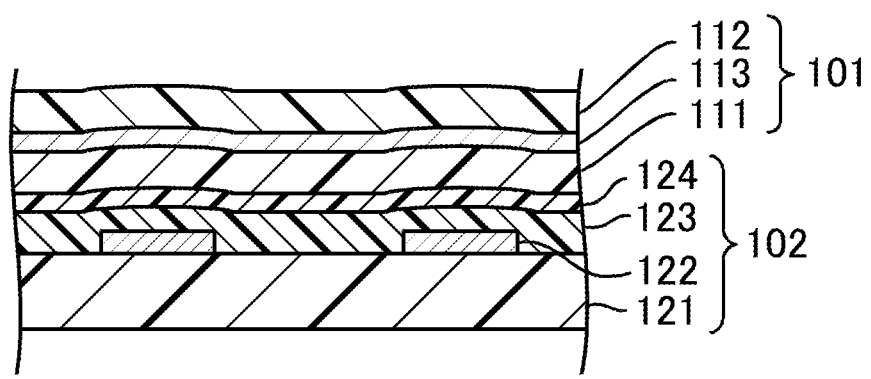
FIG. 2 is a cross-sectional view of a shield wiring board according to an embodiment.
Figure 3:
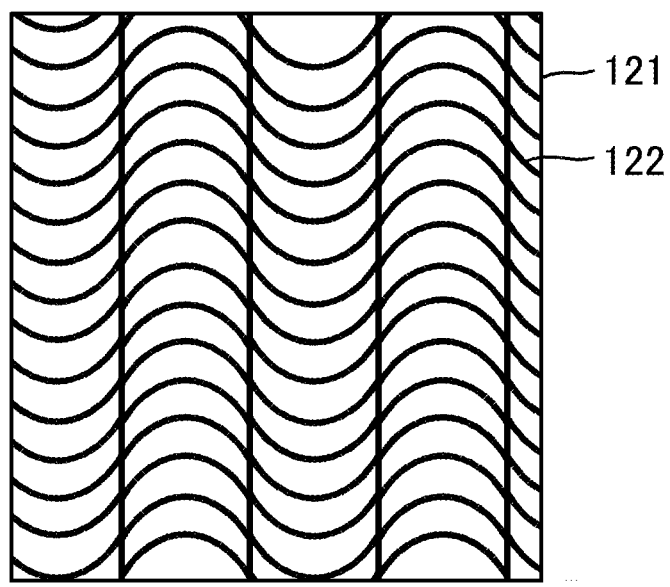
FIG. 3 is a plan view of a printed wiring board used in an evaluation of a concealing property.

The electromagnetic-wave shielding film 101 according to this embodiment is adhered to the printed wiring board 102 as shown in FIG. 2. The printed wiring board 102 includes, for example, a base layer 121, a circuit pattern 122 on a surface of the base layer 121, and an insulating film 124 adhered to the base layer 121 via the adhesive layer 123 so as to cover the circuit pattern 122.

The base layer 121 is made from an insulating material. As the insulating material, an insulating resin composition or ceramic may be used, for example. As the insulating resin composition, may be used is at least one selected from the group consisting of a polyimide-based resin, a polyamide-imide-based resin, a polyamide-based resin, a polyetherimide-based resin, a polyesterimide-based resin, a polyether nitrile-based resin, a polyether sulfone-based resin, a polyphenylene sulfide-based resin, a polyethylene terephthalate-based resin, a polypropylene-based resin, a crosslinking polyethylene-based resin, a polyester-based resin, a polybenzimidazole-based resin, a polyimide-based resin, a polyimideamide-based resin, a polyetherimide-based resin, and a polyphenylene sulfide-based resin.

The circuit pattern 122 is constituted by a conductive material. As the conductive material, a conductive material obtained by printing and curing a mixture of a metal foil or conductive filler with a resin composition may be used, and a copper foil is preferably used from the viewpoint of the cost.

The thickness of the circuit pattern 122 is preferably 1 μm to 100 μm, more preferably 1 μm to 50 μm without particular limitation. The circuit pattern with a thickness of 1 μm or more allows the production cost of the printed wiring board 102 to be reduced. The circuit pattern with a thickness of 100 μm or less allows the printed wiring board 102 to be thinner.

The adhesive layer 123 is formed from an insulating material. As the insulating material, an insulating resin composition is preferable, and may be used is at least one selected from the group consisting of a polyimide-based resin, a polyamideimide-based resin, a polyamide-based resin, a polyetherimide-based resin, a polyesterimide-based resin, a polyether nitrile-based resin, a polyether sulfone-based resin, a polyphenylene sulfide-based resin, a polyethylene terephthalate-based resin, a polypropylene-based resin, a crosslinking polyethylene-based resin, a polyester-based resin, a polybenzimidazole-based resin, a polyimide-based resin, a polyimideamide-based resin, a polyetherimide-based resin, and a polyphenylene sulfide-based resin.

The thickness of the adhesive layer 123 is preferably 1 μm to 50 μm without particular limitation.

The insulating film 124 is formed from an insulating material. As the insulating material, an insulating resin composition is preferable, and may be used is at least one selected from the group consisting of a polyimide-based resin, a polyamideimide-based resin, a polyamide-based resin, a polyetherimide-based resin, a polyesterimide-based resin, a polyether nitrile-based resin, a polyether sulfone-based resin, a polyphenylene sulfide-based resin, a polyethylene terephthalate-based resin, a polypropylene-based resin, a crosslinking polyethylene-based resin, a polyester-based resin, a polybenzimidazole-based resin, a polyimide-based resin, a polyimideamide-based resin, a polyetherimide-based resin, and a polyphenylene sulfide-based resin.

The thickness of the insulating film 124 is preferably 1 μm to 100 μm, more preferably 10 μm to 25 μm without particular limitation. The insulating film 124 with a thickness of 1 μm or more allows the production cost of the printed wiring board 102 to be reduced. The insulating film 124 with a thickness of 100 μm or less allows the printed wiring board 102 to be thinner.

When the insulating protective layer 112 is colored to make the electromagnetic-wave shielding film 101 opaque, the circuit pattern 122 is directly invisible. For example, covering the circuit pattern 122 with a film having a total light transmittance of preferably 20% or less, more preferably 10% or less, yet more preferably 5% or less makes the circuit pattern 122 almost invisible directly. However, the circuit pattern 122 forms asperities on the surface of the insulating protective layer 112. The commonly used circuit pattern 122 is formed of copper lines, and has a height of several micrometers to several tens of micrometers. The difference in height between the portion where the line is present and the portion where the line is not present is small due to the embedding of the adhesive layer 123 and the conductive adhesive layer 111, and thus, the heights of the asperities on the surface of the insulating protective layer 112 is several micrometers. However, the presence of the asperities with such a small height can be visually recognized on a glossy surface that easily reflects light, and thus, the circuit pattern 122 cannot be concealed.

For this reason, it is conceivable to reduce the glossiness on the surface of the insulating protective layer 112 in order to conceal the circuit pattern 122. However, the present inventors have found that the circuit pattern concealing property does not correlate with 85° glossiness. Further, the glossiness is assumed to be greatly affected by the surface roughness. However, the present inventors have further found that the circuit pattern concealing property does not correlate with the three-dimensional arithmetical mean height (Sa) in accordance with the International Organization for Standardization (ISO) 25178, which is a general indicator of the surface roughness.

The present inventors have also found that the circuit pattern concealing property correlates well with the areal material ratio (Smr2) that divides reduced valleys from a core in accordance with the International Organization for Standardization (ISO) 25178, and when the Smr2 is 91% or less, preferably 90% or less, the circuit pattern concealing property is excellent. This is considered because some valleys from the core cause the incident light to be more likely to be scattered. The Smr2 is preferably 70% or more, more preferably 80% or more, yet more preferably 85%. The Smr2 of 70% or more reduces the proportion of the valleys, thereby reducing a surface reflection at the bottoms of the valleys. This reduction allows the concealing property to be improved.

The deeper the reduced valleys are, the more likely the incident light is scattered. Thus, the reduced valley depth Svk in accordance with the International Organization for Standardization (ISO) 25178 is preferably 0.45 μm or more, more preferably 0.49 μm or more, yet more preferably 0.60 μm or more, yet more preferably 0.70 μm or more. The Svk is preferably 3.0 μm or less, more preferably 2.0 μm or less, yet more preferably 1.5 μm or less, yet more preferably 1.0 μm or less. The Svk of 3.0 μm improves releasability of the separable base having surface asperities from an insulating protective layer when the shape of the surface of the separable base is transferred to an insulating protective layer to produce the insulating protective layer having asperities.

In order to make the Smr2 of the insulating protective layer 112 be 91% or less, fine particles may be added to a resin for forming the insulating protective layer 112.

As the fine particles to be added to the insulating protective layer 112, resin fine particles or inorganic fine particles may be used, for example, without particular limitation. Examples of the resin fine particle include acrylic resin fine particles, polyacrylonitrile fine particles, polyurethane fine particles, polyamide fine particles, and polyimide fine particles. Examples of the inorganic fine particles include calcium carbonate fine particles, calcium silicate fine particles, clay, kaolin, talc, silica fine particles, glass fine particles, diatomite, a mica powder, alumina fine particles, magnesium oxide fine particles, zinc oxide fine particles, barium sulfate fine particles, aluminium sulfate fine particles, calcium sulfate fine particles, and magnesium carbonate fine particles. For the resin fine particles or the inorganic fine particles, one kind may be used alone, or two or more kinds may be used in combination.

Surface asperities are preferably provided in order for the insulating protective layer 112 to have Smr2 of 91% or less. The surface asperities are provided by applying a resin composition for an insulating protective layer 112 to the surface of a separable base which has asperities formed by, for example, embossing and drying the resin composition to transfer the asperities on the separable base to the insulating protective layer 112. As a substitute for the embossing, a film obtained by providing surface asperities on the surface of a matte layer may be used as a separable base. The matte layer may be formed by applying a resin composition containing fine particles to the surface of a film, or embossing a resin layer formed on the surface of the film.

As a substitute for using a separable base having asperities, used is any of known methods such as: a method in which a resin composition containing fine particles are applied to the surface of a shielding layer, and then dried to form an insulating protective layer 112 having asperities; a method in which dry ice is sprayed on the surface of an insulating protective layer 112; or a method in which an active energy ray-curable composition is applied to the surface of a shielding layer, a mold having asperities is then pressed against the obtained curable composition layer, the curable composition layer is cured, and the mold is removed.

Further, in a preferred embodiment, a black pigment or a black-based colorant such as a pigment mixture obtained by blackening a subtractive color mixture of a plurality of pigments is added to the insulating protective layer 112. Examples of the black pigment include carbon black, ketjen black, carbon nanotubes (CNTs), perylene black, titan black, iron black, aniline black, and combinations thereof. As the pigment mixture, a mixture of pigments such as red, green, blue, yellow, purple, cyan, and magenta may be used.

Examples of a resin component constituting the insulating protective layer 112 include a thermoplastic resin, a thermosetting resin, and an active energy ray-curable resin.

As the thermoplastic resin, any of a styrene-based resin, a vinyl acetate-based resin, a polyester-based resin, a polyethylene-based resin, a polypropylene-based resin, an imide-based resin, or an acrylic resin may be used without particular limitation. As the thermosetting resin, a phenolic resin, an epoxy-based resin, a urethane-based resin, a melamine-based resin, a polyamide-based resin, or an alkyd-based resin may be used without particular limitation. As the active energy ray-curable resin, for example, a polymerizable compound having at least two (meth)acryloyloxy groups in a molecule may be used without particular limitation. The insulating protective layer 112 may be made from a single material, or two or more kinds of materials. The insulating protective layer 112 may be a stack of two or more layers made from different materials or having different physical properties such as the hardness or the elasticity modulus. In this case, the Smr2 of the topmost layer may be controlled to be a predetermined value.

The insulating protective layer 112 may contain, as necessary, at least one of a curing promoter, a tackifier agent, an antioxidant, a pigment, a dye, a plasticizer, an ultraviolet absorber, an anti-foam agent, a leveling agent, a filler, a fire retardant, a viscosity modifier, or an antiblocking agent.

The thickness of the insulating protective layer 112 may be set appropriately as necessary, and may be preferably 1 µm or more, more preferably 4 µm or more, and preferably 20 µm or less, more preferably 10 µm or less, yet more preferably 5 µm or less. The insulating protective layer 112 with a thickness of 1 µm or more allows the conductive adhesive layer 111 and the shielding layer 113 to be sufficiently protected. The insulating protective layer 112 with a thickness of 20 µm or less allows flexibility of the electromagnetic-wave shielding film 101 to be ensured, and allows the electromagnetic-wave shielding film 101 to be easily applied to a member required to have flexibility.

If the shielding layer 113 is provided, the shielding layer 113 may be formed from a metal foil, a vapor-deposited film, or a conductive filler.

The metal foil may be a foil made from any of nickel, copper, silver, tin, gold, palladium, aluminum, chromium, titanium, or zinc, or an alloy of two or more of them, without particular limitation.

The thickness of the metal foil is preferably 0.5 µm or more, more preferably 1.0 µm or more without particular limitation. The metal foil with a thickness of 0.5 µm or more allows, when a high frequency signal of 10 MHz to 100 GHz is transmitted to the shield printed wiring board, the attenuation of the high frequency signal to be reduced. The thickness of the metal foil is preferably 12 µm or less, more preferably 10 µm or less, yet more preferably 7 µm or less. The metal layer with a thickness of 12 µm or less allows good breaking elongation to be ensured.

The vapor-deposited film may be formed by vapor deposition of nickel, copper, silver, tin, gold, palladium, aluminum, chromium, titanium, or zinc, without particular limitation. For the vacuum deposition, any of electrolytic plating, electroless plating, sputtering, electron-beam vapor deposition, vacuum deposition, chemical vapor deposition (CVD), or metal organic chemical vapor deposition (MOCVD) may be used.

The thickness of the vapor-deposited film is preferably 0.05 µm or more, more preferably 0.1 µm or more, without particular limitation. The vapor-deposited film with a thickness of 0.05 µm or more allows the electromagnetic-wave shielding film in the shield printed wiring board to have an excellent characteristic of shielding electromagnetic waves. The thickness of the vapor-deposited film is preferably less than 0.5 µm, more preferably less than 0.3 µm. The vapor-deposited film with a thickness of less than 0.5 µm allows the electromagnetic-wave shielding film to have excellent flexural resistance, thereby allowing reduction in breakage of the shielding layer caused by steps provided in the printed wiring board.

For the conductive filler, a shielding layer 113 may be formed by applying a solvent containing a conductive filler to the surface of the insulating protective layer 112 and then drying the solvent. As the conductive filler, any of a metal filler, a metal-sheathed resin filler, a carbon filler, or a mixture of these fillers may be used. As the metal filler, any of a copper powder, a silver powder, a nickel powder, a silver-coated copper power, a gold-coated copper powder, a silver-coated nickel powder, or a gold-coated nickel powder may be used. These metal powders can be obtained through electrolysis, atomization, or reduction. The metal powders may be in spherical, flake, fiber, dendritic, or another form.

In this embodiment, the thickness of the shielding layer 113 may be selected, as appropriate, according to the required electromagnetic-wave shielding effect and tolerance to repeated flexing and sliding. However, for the shielding layer being a metal foil, the thickness is preferably 12 µm or less in order to ensure the breaking elongation.

In this embodiment, the conductive adhesive layer 111 contains at least one of a thermoplastic resin, a thermosetting resin, or active energy ray-curable resin, and contains a conductive filler.

For the conductive adhesive layer 111 containing a thermoplastic resin, examples of the thermoplastic resin used include a styrene-based resin, a vinyl acetate-based resin, a polyester-based resin, a polyethylene-based resin, a polypropylene-based resin, an imide-based resin, and an acrylic resin. One kind of these resins may be used alone, or two or more kinds of them may be used in combination.

For the conductive adhesive layer 111 containing a thermosetting resin, examples of the thermosetting resin used include a phenolic resin, an epoxy-based resin, a urethane-based resin, a melamine-based resin, a polyamide-based resin, a polyimide-based resin, and an alkyd-based resin. As the active energy ray-curable resin, for example, a polymerizable compound having at least two (meth)acryloyloxy groups in a molecule may be used without particular limitation. One kind of these resins may be used alone, or two or more kinds of them may be used in combination.

The thermosetting resin contains, for example, a first resin component having a first functional group having reactivity, and a second resin component having a second functional group reactive with the first functional group. Examples of the first functional group include an epoxy group, an amide group, and a hydroxyl group. A second functional group may be selected according to the first functional group. For example, for the first functional group being an epoxy group, the second functional group may be a hydroxyl group, a carboxyl group, an epoxy group, or an amino group. For the first resin component being an epoxy resin, specific examples of the second resin component include an epoxy group-modified polyester resin, an epoxy group-modified polyamide resin, an epoxy group-modified acrylic resin, an epoxy group-modified polyurethane polyurea resin, a carboxyl group-modified polyester resin, a carboxyl group-modified polyamide resin, a carboxyl group-modified acrylic resin, a carboxyl group-modified polyurethane polyurea resin, and a urethane-modified polyester resin. Among these resins, a carboxyl group-modified polyester resin, a carboxyl group-modified polyamide resin, a carboxyl group-modified polyurethane polyurea resin, and a urethane-modified polyester resin are preferable. For the first resin component being a resin having a hydroxyl group, the second resin component used may be an epoxy group-modified polyester resin, an epoxy group-modified polyamide resin, an epoxy group-modified acrylic resin, an epoxy group-modified polyurethane polyurea resin, a carboxyl group-modified polyester resin, a carboxyl group-modified polyamide resin, a carboxyl group-modified acrylic resin, a carboxyl group-modified polyurethane polyurea resin, or a urethane-modified polyester resin. Among these resins, a carboxyl group-modified polyester resin, a carboxyl group-modified polyamide resin, a carboxyl group-modified polyurethane polyurea resin, and a urethane-modified polyester resin are preferable.

The thermosetting resin may contain a curing agent which promotes a thermosetting reaction. For the thermosetting resin having a first functional group and a second functional group, the curing agent may be selected, as appropriate, according to the kinds of the first functional group and the second functional group. For the first functional group being an epoxy group, and the second functional group being a hydroxyl group, the curing agent used may be any of an imidazole-based curing agent, a phenolic curing agent, or a cationic curing agent. One kind of these curing agents may be used alone, or two or more kinds of them may be used in combination. In addition, the thermosetting resin may further contain, as an optional component, any of an anti-foam agent, an antioxidant, a viscosity modifier, a diluent, an anti-settling agent, a leveling agent, a coupling agent, a colorant, or a fire retardant.

As the conductive filler, for example, any of a metal filler, a metal-sheathed resin filler, a carbon filler, or a mixture of these fillers may be used without particular limitation. The metal filler may be any of a copper powder, a silver powder, a nickel powder, a silver-coated copper power, a gold-coated copper powder, a silver-coated nickel powder, or a gold-coated nickel powder. These metal powders can be obtained through electrolysis, atomization, or reduction. Among these metal fillers, any of a silver powder, a silver-coated copper powder, or a copper powder is preferable.

The conductive filler has an average particle diameter of preferably 1 μm or more, more preferably 3 μm or more, and preferably 50 μm or less, more preferably 40 μm or less from the viewpoint of contact between fillers. The conductive filler may be in spherical, flake, fiber, dendritic, or fiber without particular limitation.

The content of the conductive filler may be selected, as appropriate, according to the intended use, and is preferably 5 mass % or more, more preferably 10 mass % or more, and preferably 95 mass % or less, more preferably 90 mass % or less in the total solid content. In terms of embeddability, the content of the conductive filler is preferably 70 mass % or less, more preferably 60 mass % or less. In order to achieve anisotropic conductivity, the content of the conductive filler is preferably 40 mass % or less, more preferably 35 mass % or less.

In terms of embeddability, the thickness of the conductive adhesive layer 111 is preferably 1 μm to 50 μm.

The conductive adhesive layer 111 may be a layer having tackiness, i.e., adhesiveness at room temperature (e.g., 20° C.). The conductive adhesive layer 111 having tackiness at room temperatures allows the electromagnetic-wave shielding film 101 to be adhered at any position of the printed wiring board 102.

For the electromagnetic-wave shielding film 101 having a shielding layer 113 made from, for example, a metal foil, the total light transmittance is generally approximately 0. Without the shielding layer 113, the total light transmittance may be brought to be preferably 20% or less, more preferably 10% or less, yet more preferably 5% or less by adjusting the amounts of the colorant, the filler, and other agents added to the insulating protective layer 112 and/or the conductive adhesive layer 111. The total light transmittance of 20% or less allows the circuit pattern 122 to be less visible directly when the electromagnetic-wave shielding film 101 is adhered to the printed wiring board 102. The total light transmittance can be measured in accordance with JIS K 7136.

Although this embodiment shows an example where an adhesive film for a printed wiring board is an electromagnetic-wave shielding film, the adhesive film for a printed wiring board does not have an electromagnetic-wave shielding function in some cases. For the adhesive layer without an electromagnetic-wave shielding function, a non-conductive adhesive layer without containing a conductive filler may be used as a substitute for the conductive adhesive layer. If the electromagnetic-wave shielding function is unnecessary, the shielding layer is not required. Note, however, that a metal foil may be provided between the adhesive layer and the insulating protective layer so as to reduce the total light transmittance.

EXAMPLES

The adhesive film for a printed wiring board of the present disclosure will now be described in detail below using the following examples. The following examples are mere examples, and the present invention is not limited thereby.

<Formation of Separable Base>

Asperities were formed by spraying dry ice fine particles on the surface of a polyethylene terephthalate film (hereinafter referred to as PET film) with a thickness of 25 μm, and a separable layer made from a melamine-based resin was then provided thereon, thereby forming a separable base 1.

A matte layer composition was prepared from silica particles, a melamine-based resin, and toluene, and was then applied to the surface of the polyethylene terephthalate film with a thickness of 25 μm using a wire bar and dried by heating, thereby obtaining a separable base 2 having a matte layer with a thickness of 5 μm. Separable bases 3 to 9 with different surface conditions were obtained in the same manner by changing the particle diameter and the amount of the silica particles added. Table 1 summarizes the surface properties of the separable bases 1 to 9 (the surfaces on which the concealing layer is to be formed).

TABLE 1

| | | Separable Base | | | | | | | | |
|---|---|---|---|---|---|---|---|---|---|---|
| | | 1 | 2 | 3 | 4 | 5 | 6 | 7 | 8 | 9 |
| Surface Properties | Smr2 (%) | 91.6 | 92.2 | 91.3 | 89.1 | 91.4 | 88.6 | 90.5 | 95.4 | 90.6 |
| | Svk (μm) | 0.6 | 0.5 | 0.7 | 0.5 | 1.0 | 0.7 | 0.5 | 0.2 | 0.4 |
| | Sa (μm) | 0.4 | 0.5 | 0.6 | 0.3 | 0.7 | 0.6 | 0.6 | 0.6 | 0.4 |

<Formation of Insulating Protective Layer>

100 parts by mass of a bisphenol A-type epoxy-based resin (jER1256, manufactured by Mitsubishi Chemical Corporation), 0.1 parts by mass of a curing agent (ST14, manufactured by Mitsubishi Chemical Corporation), and 15 parts by mass of carbon particles (TOKABLACK #8300/F, manufactured by Tokai Carbon Co., Ltd.) as a black-based colorant were blended in toluene so as to have a solid content of 20 wt %. Thus, a resin composition for an insulating protective layer was prepared. This composition was then applied to the surface of the separable base with a wire bar, and dried by heating, thereby forming an insulating protective layer with a thickness of 5 μm on the surface of the separable base. Thereafter, a 0.1 μm-thick Ag vapor-deposited film was formed on the protective layer as a shielding layer.

<Formation of Adhesive Layer>

100 parts by mass of bisphenol A-type epoxy-based resin (jER1256, manufactured by Mitsubishi Chemical Corporation), 0.1 parts by mass of a curing agent (ST14, manufactured by Mitsubishi Chemical Corporation), and 30 parts by mass of a dendrite silver-coated copper powder with an average particle diameter of 15 μm were added to toluene so as to have a solid content of 20 wt %, which were then mixed by stirring. Thus, a composition for an adhesive layer was prepared. The obtained composition for an adhesive layer was then applied to a PET film having a separation-treated surface (hereinafter referred to as support film) with a wire bar, and then dried by heating. Thus, an adhesive layer with a thickness of 5 μm was formed on the surface of the support film.

<Formation of Adhesive Film for Printed Wiring Board>

The surface of the insulating protective layer on the Ag vapor-deposited film side formed on the separable base and the adhesive layer formed on the support film were adhered to each other, then pressurized at a pressure of 5 MPa with a pair of metal rolls heated to 100° C. Thus, an adhesive film for a printed wiring board was obtained as an electromagnetic-wave shielding film.

<Formation of Shield Wiring Board>

The obtained adhesive film for a printed wiring board and a printed wiring board were adhered with a press machine at a temperature of 170° C., a pressure of 2 to 3 MPa, for 3 minutes, and the separable base was then removed. Thus, a shield wiring board was formed.

Figure 4:
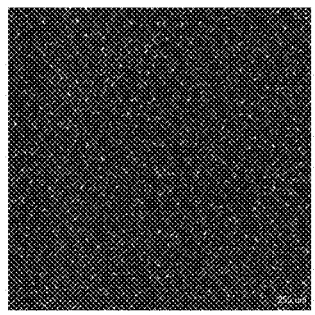
FIG. 4 is a photograph illustrating an observation result by a confocal microscope.
Figure 4:
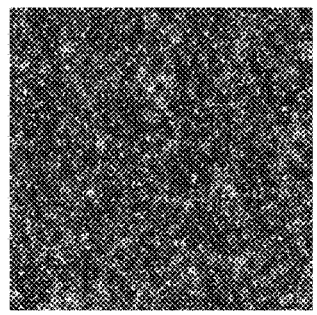
Figure 4:
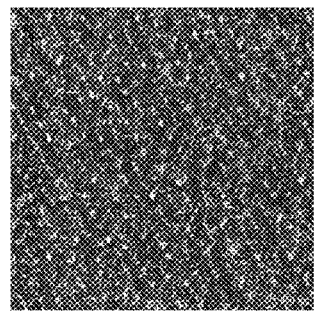
Figure 4:
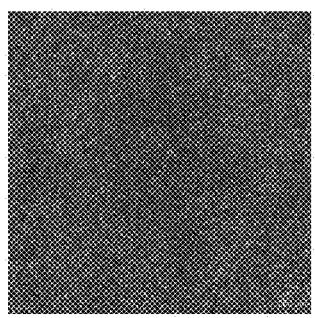
Figure 4:
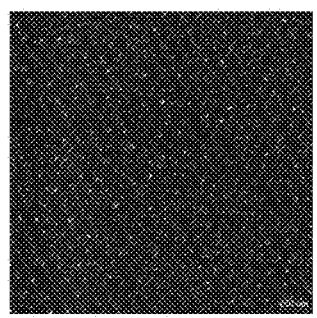
Figure 4:
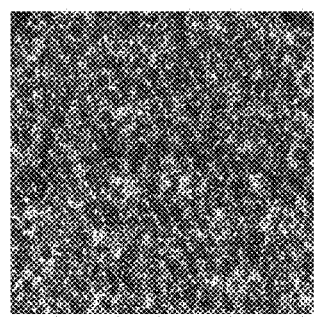
Figure 4:
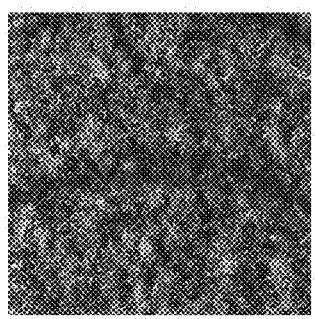
Figure 4:
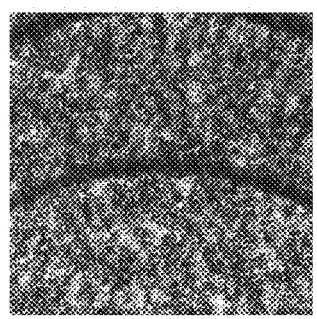
Figure 4:
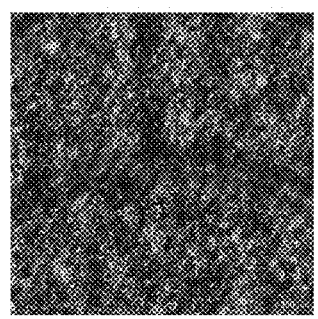

As a printed wiring board, one where a circuit pattern 122 such as illustrated in FIG. 4 was formed on a base layer 121 made from a polyimide film was used. The circuit pattern 122 was formed of a copper foil having a line width of 0.1 mm and a height of 12 μm. On the base layer 121, an adhesive layer with a thickness of 25 μm and a cover lay (insulating film) made from a polyimide film and with a thickness of 12.5 μm were provided so as to cover the circuit pattern 122.

<Measurement of Glossiness>

The 85° glossiness was measured in accordance with JIS Z 8741 using a portable glossmeter (BYK-Gardner Micro-Gloss, manufactured by Toyo Seiki Seisaku-sho, Ltd.).

<Measurement of Surface Roughness>

The surface roughness of each of arbitrary five points on the surface was measured in accordance with ISO 25178 using a confocal microscope (OPTELICS HYBRID with an objective lens 20×, manufactured by Lasertec). After this measurement, a tilt of the surface was compensated using data analysis software (LMeye7), and Smr2, Svk, and Sa were measured. An S filter had a cut-off wavelength of 0.0025 mm, and an L filter had a cut-off wavelength of 0.8 mm. In addition, each numerical value was taken as an average value of values measured at arbitrary five points on the surface.

<Evaluation of Concealing Property>

The shield wiring board was placed on a flat table, and in an environment where the illuminance of the surface of the shield wiring board was 500 lux, evaluated was whether the circuit pattern was visible from the side of the insulating protective layer at an angle of 45° and at a height of 30 cm from the shield wiring board. The case where the circuit pattern was invisible was evaluated as good concealing property (○), and the case where the circuit pattern was visible was evaluated as poor concealing property (x).

Example 1

An adhesive film for a printed wiring board was formed from the insulating protective layer formed using the separable base 1, thereby obtaining a shield wiring board. After removal of the separable base, the insulating protective layer of the shield wiring board had Smr2 of 90.1%, and Svk of 0.62 μm. The 85° glossiness was 33.7, and the Sa was 0.48 μm. The circuit pattern was invisible by visual observation, and the really good concealing property was obtained. The circuit pattern was barely visible by observation with a confocal microscope.

Example 2

A shield wiring board was obtained in the same manner as in Example 1 except that the separable base 2 was used.

After removal of the separable base, the insulating protective layer of the shield wiring board had Smr2 of 90.8%, and Svk of 0.55 μm. The 85° glossiness was 28.7, and the Sa was 0.41 μm. The circuit pattern was invisible by visual observation, and the really good concealing property was obtained. The circuit pattern was barely visible by observation with a confocal microscope.

Example 3

A shield wiring board was obtained in the same manner as in Example 1 except that the separable base 3 was used. After removal of the separable base, the insulating protective layer of the shield wiring board had Smr2 of 90.0%, and Svk of 0.71 μm. The 85° glossiness was 32.3, and the Sa was 0.51 μm. The circuit pattern was invisible by visual observation, and the really good concealing property was obtained. The circuit pattern was barely visible by observation with a confocal microscope.

Example 4

A shield wiring board was obtained in the same manner as in Example 1 except that the separable base 4 was used. After removal of the separable base, the insulating protective layer of the shield wiring board had Smr2 of 89.6%, and Svk of 0.49 μm. The 85° glossiness was 41.1, and the Sa was 0.42 μm. The circuit pattern was invisible by visual observation, and the good concealing property was obtained. The circuit pattern was slightly visible by observation with a confocal microscope.

Example 5

A shield wiring board was obtained in the same manner as in Example 1 except that the separable base 5 was used. After removal of the separable base, the insulating protective layer of the shield wiring board had Smr2 of 90.8%, and Svk of 0.90 μm. The 85° glossiness was 12.6, and the Sa was 0.83 μm. The circuit pattern was invisible by visual observation, and the really good concealing property was obtained. The circuit pattern was barely visible by observation with a confocal microscope.

Example 6

A shield wiring board was obtained in the same manner as in Example 1 except that the separable base 6 was used. After removal of the separable base, the insulating protective layer of the shield wiring board had Smr2 of 89.1%, and Svk of 0.63 μm. The 85° glossiness was 30.0, and the Sa was 0.47 μm. The circuit pattern was invisible by visual observation, and the really good concealing property was obtained. The circuit pattern was barely visible by observation with a confocal microscope.

Comparative Example 1

A shield wiring board was obtained in the same manner as in Example 1 except that the separable base 7 was used. After removal of the separable base, the insulating protective layer of the shield wiring board had Smr2 of 92.1%, and Svk of 0.39 μm. The 85° glossiness was 30.6, and the Sa was 0.45 μm. The circuit pattern was visible by visual observation, and the poor concealing property was obtained. The circuit pattern was clearly visible by observation with a confocal microscope.

Comparative Example 2

A shield wiring board was obtained in the same manner as in Example 1 except that the separable base 8 was used. After removal of the separable base, the insulating protective layer of the shield wiring board had Smr2 of 93.9%, and Svk of 0.29 μm. The 85° glossiness was 39.9, and the Sa was 0.43 μm. The circuit pattern was visible by visual observation, and the poor concealing property was obtained. The circuit pattern was clearly visible by observation with a confocal microscope.

Comparative Example 3

A shield wiring board was obtained in the same manner as in Example 1 except that the separable base 9 was used. After removal of the separable base, the insulating protective layer of the shield wiring board had Smr2 of 92.8%, and Svk of 0.43 μm. The 85° glossiness was 37.0, and the Sa was 0.45 μm. The circuit pattern was visible by visual observation, and the poor concealing property was obtained. The circuit pattern was clearly visible by observation with a confocal microscope.

Table 2 summarizes characteristics of the insulating protective layers and circuit pattern concealing properties of Examples and Comparative Examples. When Smr2 was 91 or less, the good concealing property was obtained.

TABLE 2

|  | Examples | | | | | | Comparative Examples | | |
| --- | --- | --- | --- | --- | --- | --- | --- | --- | --- |
|  | 1 | 2 | 3 | 4 | 5 | 6 | 1 | 2 | 3 |
| 85° Glossiness | 33.7 | 28.7 | 32.3 | 41.1 | 12.6 | 30.0 | 30.6 | 39.9 | 37.0 |
| Smr2 (%) | 90.1 | 90.8 | 90.0 | 89.6 | 90.8 | 89.1 | 92.1 | 93.9 | 92.8 |
| Svk (μm) | 0.62 | 0.55 | 0.71 | 0.49 | 0.90 | 0.63 | 0.39 | 0.29 | 0.43 |
| Sa (μm) | 0.48 | 0.41 | 0.51 | 0.42 | 0.83 | 0.47 | 0.45 | 0.43 | 0.45 |
| Concealing Property | ○ | ○ | ○ | ○ | ○ | ○ | × | × | × |

FIG. 4 shows results of the observations with a confocal microscope in Examples and Comparative Examples. In each of Examples, the shape of the circuit pattern was barely visible, whereas in each of Comparative Examples, the shape of the circuit pattern was clearly visible.

INDUSTRIAL APPLICABILITY

The electromagnetic-wave shielding film and an adhesive film for a printed wiring board of the present disclosure have excellent concealing property, and thus are useful for the applications where a circuit pattern is required to be concealed.

DESCRIPTION OF REFERENCE CHARACTERS

101 Electromagnetic-Wave Shielding Film
102 Printed Wiring Board
111 Conductive Adhesive Layer
112 Insulating Protective Layer
113 Shielding Layer
121 Base Layer
122 Circuit Pattern
123 Adhesive Layer
124 Insulating Film

The invention claimed is:

1. An adhesive film for a printed wiring board, the adhesive film comprising:
   an adhesive layer; and
   an insulating protective layer,
   wherein the insulating protective layer has an areal material ratio (Smr2) of 91% or less, the areal material ratio (Smr2) dividing reduced valleys from a core, and
   the adhesive layer has conductivity, and the adhesive film functions as an electromagnetic-wave shielding film.

2. The adhesive film of claim 1, wherein the insulating protective layer has a reduced valley depth (Svk) of 0.45 μm or more.

3. The adhesive film of claim 1, further comprising a shielding layer interposed between the adhesive layer and the insulating protective layer.

4. A shield wiring board comprising:
   a circuit board including a base layer, a circuit pattern on the base layer, and an insulating film adhered to the base layer so as to cover the circuit pattern; and
   the adhesive film of claim 1 adhered to the insulating film.

5. The shield wiring board of claim 4, further comprising a shielding layer interposed between the adhesive layer and the insulating protective layer.

* * * * *